United States Patent
Bomholt et al.

(10) Patent No.: US 8,315,115 B2
(45) Date of Patent: Nov. 20, 2012

(54) METHOD FOR TESTING A MAIN MEMORY

(75) Inventors: John Bomholt, Hinnerup (DK); Flemming Hedegaard, Bjerringbro (DK); Jorn Skjellerup Rasmussen, Bjerringbro (DK); Neils Jorgen Strom, Hinnerup (DK)

(73) Assignee: Grundfos Management a/s, Bjerringbro (DK)

( * ) Notice: Subject to any disclaimer, the term of this patent is extended or adjusted under 35 U.S.C. 154(b) by 71 days.

(21) Appl. No.: 12/742,962

(22) PCT Filed: Nov. 11, 2008

(86) PCT No.: PCT/EP2008/009486
§ 371 (c)(1),
(2), (4) Date: May 14, 2010

(87) PCT Pub. No.: WO2009/062655
PCT Pub. Date: May 22, 2009

(65) Prior Publication Data
US 2010/0246301 A1    Sep. 30, 2010

(30) Foreign Application Priority Data
Nov. 15, 2007   (EP) .................................... 07075997

(51) Int. Cl.
*G11C 29/00* (2006.01)
(52) U.S. Cl. ........ 365/200; 365/201; 714/718; 714/719; 714/720
(58) Field of Classification Search .................. 365/200, 365/201; 714/718, 719, 720
See application file for complete search history.

(56) References Cited

U.S. PATENT DOCUMENTS

| | | | | |
|---|---|---|---|---|
| 4,485,471 A * | 11/1984 | Singh et al. | ................... | 365/200 |
| 5,222,066 A * | 6/1993 | Grula et al. | ................... | 714/718 |
| 5,461,588 A | 10/1995 | Sardeson et al. | | |
| 5,479,413 A * | 12/1995 | Sicola et al. | ................... | 714/718 |
| 5,577,050 A * | 11/1996 | Bair et al. | ................... | 365/201 |
| 6,067,262 A * | 5/2000 | Irrinki et al. | ................... | 365/201 |
| 6,330,696 B1 * | 12/2001 | Zorian et al. | ................... | 714/720 |
| 6,496,950 B1 * | 12/2002 | Zhao et al. | ................... | 714/718 |
| 6,571,364 B1 * | 5/2003 | Maeno et al. | ................... | 714/720 |
| 6,711,057 B2 * | 3/2004 | Taura et al. | ................... | 365/200 |
| 7,359,262 B2 * | 4/2008 | Gotoh | ................... | 365/200 |
| 7,475,314 B2 * | 1/2009 | Chhabra et al. | ................... | 714/718 |
| 7,596,728 B2 * | 9/2009 | Tseng et al. | ................... | 365/201 |
| 2006/0129899 A1 | 6/2006 | Cochran et al. | | |
| 2006/0203599 A1 | 9/2006 | Doyle et al. | | |
| 2007/0002649 A1 | 1/2007 | Dubey | | |
| 2007/0061668 A1 | 3/2007 | Wickeraad et al. | | |

* cited by examiner

*Primary Examiner* — Trong Phan
(74) *Attorney, Agent, or Firm* — Panitch Schwarze Belisario & Nadel LLP

(57) ABSTRACT

A method for testing a primary memory of control and regulation electronics of a frequency converter is described. The primary memory includes (i) at least one matrix of memory cells, (ii) means for addressing the at least one memory cell matrix, and (iii) a write/read circuit The method includes examining at least a part of the means for addressing with regard to address errors and examining at least a part of the memory cells with regard to cell errors. The examining steps are performed independently of one another. The examining at least a part of the means for addressing includes examining individual address bits of an n-bit wide address bus in steps that are performed independently of one another. The examining is dependent on use of the primary memory for operation of the frequency converter.

17 Claims, 9 Drawing Sheets

//  METHOD FOR TESTING A MAIN MEMORY

CROSS-REFERENCE TO RELATED APPLICATIONS

This application is a Section 371 of International Application No. PCT/EP2008/009486, filed Nov. 11, 2008, which was published in the German language on May 22, 2009, under International Publication No. WO 2009/062655 A1 and the disclosure of which is incorporated herein by reference.

BACKGROUND OF THE INVENTION

The present invention relates to a method for testing a primary memory, and in particular the primary memory of the control and regulation electronics of a frequency converter, which comprises a matrix of memory cells, means for addressing the memory cell matrix and a write circuit/read circuit.

Such primary memories are counted as belonging to the state of the art and are to be found in almost all digital electronics. Here, it is the case of a semiconductor memories, e.g. RAM-chips which apart from the actual matrix of memory cells, comprise an address coder for addressing the cells by way of an address bus, as well as a write circuit/read circuit for writing and reading the data by way of a data bus. Even the smallest changes, in particular contamination in the chip, temperature fluctuations and likewise, may lead to faults, with regard to the addressing as well as with regard to the cell matrix. It is therefore counted as belonging to the state of the art, when switching on and starting up the respective apparatus equipped with such a primary memory, to completely test this, mostly at the beginning by way of self-test, and specifically with regard to the perfect functioning of the address coder and the address bus, as well as with regard to a perfect functioning of the individual memory cells. This testing is effected with the state of the art particularly in a uniform running test, in which both functions are combined and thus are examined together. Such testing methods have been known for some time, e.g. the March-X test.

However, the known testing methods have the disadvantage that they are comparatively time consuming and on account of their structure render the complete primary memory to be tested unusable during the test.

However, there exist numerous applications, with which such an initial memory test after switching on is not sufficient, in order to adequately ensure the operational reliability of the apparatus operating with the memory. This e.g. is the case with servers, which are never switched off, but also with digital circuits for motors and likewise, which run in an uninterrupted manner over a longer time. Inasmuch as this is concerned, from U.S. Pat. No. 5,461,588, it is counted as belonging to the state of the art to provide an additional auxiliary memory in which the data may be stored, which is located in the part of the primary memory which just at that moment is being tested. The method described there however, is only partly suitable for a memory test during operation of the memory, since, although the data being intermediately stored in the auxiliary memory during the test and being written into the primary memory subsequent to this, problems may however occur in the case of a change of this data. Moreover, this necessitates additional primary memory, which otherwise may not be used, as well as a suitable controller performance, in order to carry out this intermediate storage and return storage of the data.

Against this background, it is the object of the present invention to provide a method for testing the primary memory, which burdens the controller as briefly as possible and the computation performance as little as possible, so that this may also be carried out in a running operation. Moreover, it is the object of the present invention to provide a method in particular for testing the primary memory of the control and regulation electronics of a frequency converter is to be provided, which permits a testing of the primary memory during the operation, in order thus to be able to incorporate the primary memory into functions which are relevant to the reliability.

BRIEF SUMMARY OF THE INVENTION

According to the present invention, the above object is achieved by the features specified the claims. Advantageous designs of the method are specified in the claims, the subsequent description and the drawing.

The method according to the present invention for testing a primary memory, in particular the primary memory of the control and regulation electronics of a frequency converter, which comprises a matrix of memory cells, means for addressing the memory cell matrix and a write circuit/read circuit, in one step tests at least a part of the means for addressing with regard to address faults, and in another step at least a part of the memory cells with regard to cell faults, wherein the testing steps are effected independently of one another with regard to time.

Means for addressing the memory cell matrix in the context of the present invention is to be understood as all that which is necessary between the controller and the memory cell matrix, in order to carry out the necessary addressing. Counted amongst this is typically the address bus whose leads are activated e.g. via transistors, and thus may be set to 1 or 0, as well as e.g. an address coder and likewise. The faults which possibly occur in this region are to be examined with the one step, whereas the memory cells themselves are to be examined with the other step.

The basic concept of the method according to the present invention is thus to carry out the memory test in individual steps which are temporally independent of one another, so that these may also be carried out during the running operation, if e.g. parts of the primary memory are not required at that moment or are available for testing for other reasons. Thereby, the method according to the present invention basically envisages two testing steps which are temporally independent of one another, as well as independent from one another with regard to the sequence. Thereby a dividing-up of the testing is to be provided to the extent that a testing of the means for addressing, e.g. of an address bus and of the address coder with regard to address faults is effected, as well as a testing of the memory cells with regard to cell faults. Both tests may be effected in stages with an interruption or completely one after the other, or also one after the other in stages, depending on the technical application and the requirements.

It has been surprisingly found that the inventive implementation of the primary memory testing in the previously mentioned part test stages demands a significantly reduced testing time, not only for the respective part step, but also for the sum of the testing steps, than is required with testing methods according to the state of the art, when the address bus/address coder and memory cells are tested for faults in a coherent test.

Advantageously, after testing a part of the address bus/address coder with regard to address faults, one may check a part of the memory cells with regard to cell faults, whereupon a further part of the address bus/address coder is tested with regard to address faults and then the further part of the memory cells is tested with regard to cell faults, etc. Thereby, the successively tested parts of the address bus/address coder and of the memory cells do not necessarily have to correspond.

Alternatively, according to the present invention, one may also firstly test the address bus/address coder with regard to address faults and subsequently the memory cells with regard to cell faults, and this being temporally independent of one another, wherein the testing of the address bus/address coder as well as the testing of the memory cells does not need to be effected in a coherent manner, but in each case in part steps, if required.

Advantageously, the method according to the present invention for testing the primary memory is repeated in predefined time intervals, so that a thus quasi constantly tested primary memory may also be applied for components which are relevant with regard to operational reliability.

If, and this is advantageously possible with the method according to the present invention, the testing of the primary memory is effected during the operation of the device operating with the memory, in particular the frequency converter, then it is particularly useful if the controller carrying out the method is not required for other operations of the device, or is only required to a reduced extent and has free capacity for the testing method, i.e. that by way of the controller which controls the testing method, this is then only carried out if there is sufficient computation capacity available on the part of the controller, i.e. the normal operation of the device is not prevented by way of this. Such a control of the method which is dependent on the controller load is advantageously implemented in the controller. The method according to the present invention may be temporarily interrupted and subsequently continued, in each method step or part step, which is likewise advantageously controlled by the controller itself.

According to the present invention, with the one step of the testing method, with which the address bus/address coder is tested with regard to address faults, so-called stuck-at faults and/or so-called coupling faults are determined. With the former, one tests as to whether the addressing ability, as is usually effected by way of an address bus, is implemented by way of the address coder such that the addressed memory cells or memory regions, typically memory lines, may be addressed, i.e. written and read. On determining the coupling address faults, one tests as to whether the transmission by way of the address bus and the implementation by way of the address coder is unambiguous.

Advantageously, according to the present invention, not every possible memory address is tested for determining stuck-at address faults. Rather, it is sufficient to carry out the test which is subsequently described, for each address bit of the n-bits of the address bus, in order to carry out a complete testing for stuck-at address faults. If the address bus thus for example has eight address leads, which in each case have a voltage condition "low" or "high" for 0 or 1, then it is the case of an 8-bit address bus with which $2^8$ memory addresses may be defined.

For determining a stuck-at address fault, an address bit of these eight bits of the address bus is set to 1 and after this addressing via the data bus, a bit pattern is written into the memory line which is addressed by the addressing. Thereafter, the same address bit of the eight bits of the address bus is set to 0 and again a bit pattern, but one of the previously stored different bit patterns, is written into the memory line which is addressed by the addressing. Thereby, the remaining address bits are left unchanged. Then, the two previously written memory cells are read out and are tested with regard to agreement with the previously written bit patterns. If such an agreement is ascertained, then a stuck-at address fault is not present at all those memory addresses which differ only with regard to the changed address bit.

In order to carry out a complete testing of all memory addresses with regard to possible stuck-at address faults, according to the present invention, the previously described test is carried out for each of the n-bits of the address bus, thus in the previous example for each of the eight bits. Thereby, it is particularly advantageous and simple if the bit pattern written into the respective memory line contains the binary address of the associated memory line or corresponds to this. Nevertheless, with this test, one may also apply any other infinite bit pattern. What is essential is only that the bit patterns of the same address bit to be tested differ.

It is to be understood that the previously described method for determining stuck-at address faults does not necessarily need to be effected in an uninterrupted test cycle, but that e.g. in a first step, the first two address bits, in a second step the second and the third address bit, and in a third step, e.g. the fifth address bit as well as in a further step the sixth to eighth address bit, may be tested.

Independently of determining stuck-at address faults, one may effect the determining of coupling address faults on testing the address bus/address coder. For this, the method according to the present invention advantageously envisages in each case two bits of the n-bits of the address bus of the memory being set to 0, to 1 and to 0 and 1 or to 1 and 0 one after the other, wherein preferably the condition of the remaining bits remains unchanged, which however is not necessary for the method itself, but is merely advantageous. After each setting of a memory address as described previously, a bit pattern is written into the memory line which is addressed by the respective addressing. The bits patterns thereby must differ from one another. Then finally after the writing of the three bit patterns, these are read out and are tested with the previously written bit patterns with regard to agreement. If an agreement is present, then the address bus/address coder is OK as far as this is concerned, i.e. a coupling address fault is not present, at least with regard to the tested bits of the address bus.

In order to completely test the address bus/address coder with regard to coupling address faults, it is necessary to set each bit of the n-bit address bus with each of the remaining bits according to the procedure described above, to write them with different bit patterns and to subsequently test them with regard to agreement with the read bit patterns.

Even with this method, it is advantageous if the bit pattern which is written into the respective line contains the associated binary address or corresponds to this. With this method too, it is evidently not important as to whether the testing of coupling address faults is effected completely in one run or in steps in several runs. An interruption of the testing method is possible without any problem.

Independently of this, the method according to the present invention envisages determining cell faults, i.e. the testing of memory cells. Since, as previously described, the addressing is effected in lines, the testing of the memory cells itself is likewise tested in lines. Thereby, according to the first method of the present invention, adjacent memory cells of a memory line are written with 0 and 1 in an alternating manner, whereupon the line is read out and is tested with regard to the agreement with the previously written line. Thereafter, a writing of the same memory line is effected, but in the reverse manner, specifically by way of writing adjacent memory cells of the memory line with 1 and 0 in an alternating manner. Likewise, a reading-out of the line and a testing with the previously written values are carried out. If one ascertains an agreement in both cases, then the cells of the tested memory line are OK. Thus, each cell of this memory cell has been tested once with the condition 1 and once with the condition 0, wherein the adjacent cell in each case has the opposite condition.

Alternatively, the present invention envisages carrying out the cell fault test such that each individual memory cell of a memory line is written, read out and tested with 1 and the remaining memory cells with 0, in a successive manner. This method thus in lines tests cell for cell, wherein each cell must be written, read out and tested several times according to the number of cells.

It is to be understood that for carrying out the method according to the present invention by way of the controller, suitable means for addressing, the writing of the respectively addressed memory line, the reading-out of the respective addressed memory line, the storage and intermediate storage of one or more memory cells as well as means for comparing the bit patterns are provided in the controller.

With the previous embodiments, with which a bit value is specified with 0 or 1, these may also be specified the other way round, thus with 1 or 0, without basically changing the method or the method steps.

The method according to the present invention is advantageously implemented in a controller, so that at predefined time intervals it may also be carried out automatically during the operation. A particularly advantageous application example is the control and regulation electronics of a frequency converter which drives the motor of a centrifugal pump, as is applied for example in heating installations as circulation pumps, in water supply installations, in waste water installations and likewise. By way of the automatic testing of the primary memory of the control and regulation electronics, such a pump assembly may meet the increased safety demands and thus also be applied in field which are critical with regard to the reliability.

The method according to the present invention is hereinafter described by way of example and by way of specific method steps for determining faults of the address coder and faults in the matrix of memory cells.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Certain terminology is used in the following description for convenience only and is not limiting. Unless specifically set forth herein, the terms "a," "an" and "the" are not limited to one element, but instead should be read as meaning "at least one."

Figure 1:
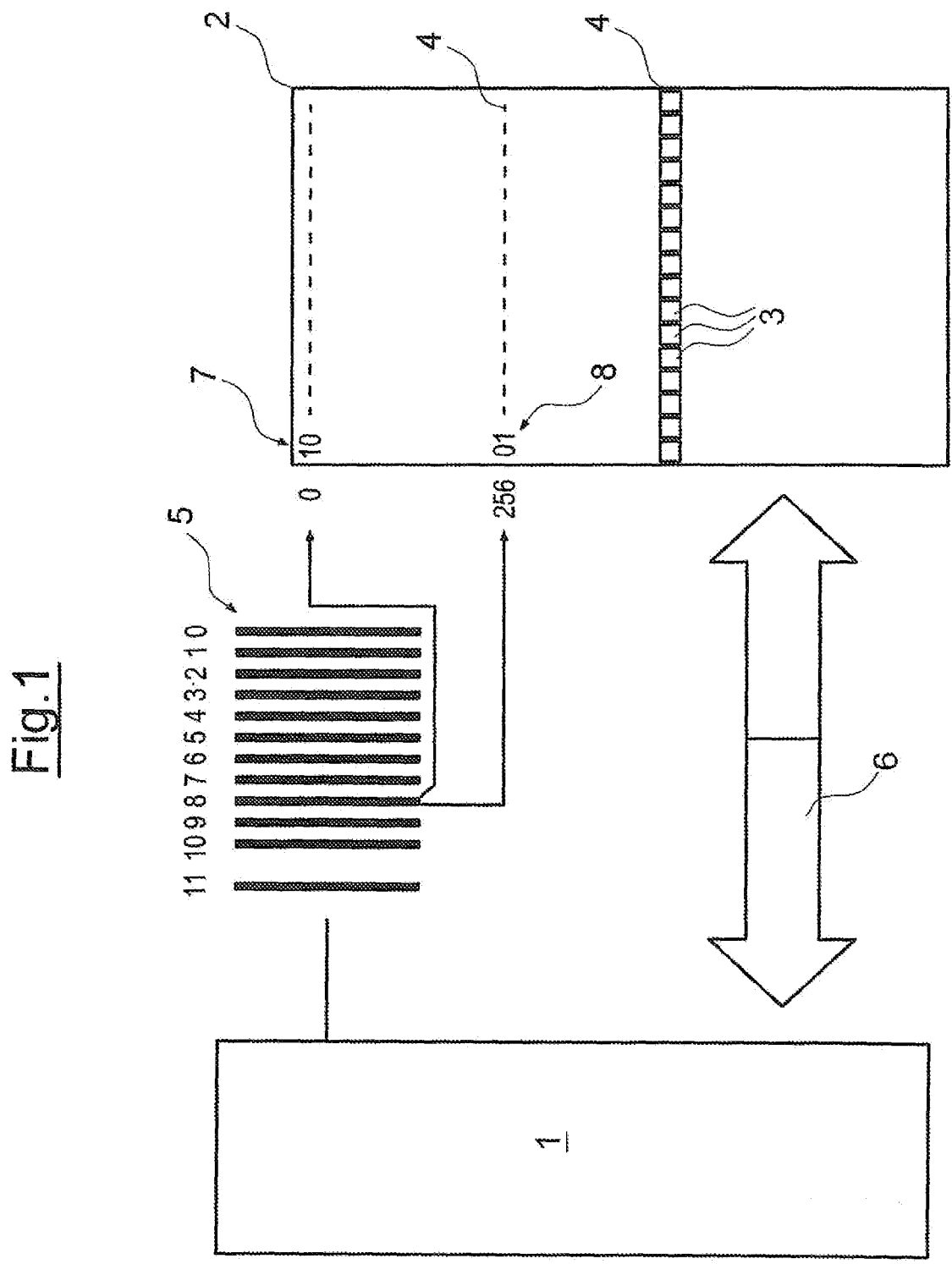
FIG. 1 is a schematic representation of a method for testing the address bus/address coder with regard to stuck-at faults according to a preferred embodiment of the present invention.

Referring to the drawings in detail, wherein like numerals indicate like elements throughout the several views, a controller 1 as part of a digital computation unit, e.g. of a microprocessor, is represented in FIG. 1. The primary memory which is addressed by the controller 1 comprises a matrix 2 of memory cells 3, which in each case may be addressed and written or read out in lines 4. For this, a write circuit/read circuit is provided, which is not shown in the drawings, as well as an address coder which is likewise not represented.

The address coder transfers the addressing which is set by the controller 1 via an address bus 5, into corresponding lines 4 of the memory cell matrix 2, i.e. the addresses selected by the controller 1, i.e. the lines 4 of the memory cell matrix 2, are addressed via the address coder and connected for the lined writing via a data bus 6 likewise affected by the controller 1, or for the lined reading-out of data.

In the represented example, the address bus 5 has a data width of 12 bits, i.e. it has twelve data leads which may lead a high or low voltage potential for the value 1 or the value 0. This 12-bit address bus may thus address $2^{12}$, i.e. 4096 different addresses. The matrix which is constructed of memory cells 3 has a data width of 16 bits. It may be addressed in a lined manner and is addressed via the data bus 6 with a corresponding data width of 16 bits.

In order to test the means for addressing, thus in particular the address bus and the address coder with regard to possible address faults (stuck-at faults), by way of example in the embodiment example according to FIG. 1, two addresses are addressed by way of the controller 1, which with regard to their addressing only differ by bit no. 8 from the in total twelve bits which are transferred in parallel via the address bus 5. Thus for testing this bit no. 8, firstly the address 000000000000 is selected, and a bit pattern 7 is written via the data bus 6 into the cell 0 of the memory cell matrix 2 which is defined by this, wherein this bit pattern with the embodiment example according to FIG. 1 is specified by way of example in the first two digits at 1 0. The addressing is then changed, but only in this bit no. 8, which is set from 0 to 1. The address 256 results by way of this. A bit pattern 8 which is different from the previously mentioned bit pattern 7 is written into the respective line 4, and the first two digits of this bit pattern are specified in the embodiment example by 0 1.

Then, hereinafter the addresses which were previously selected for the writing procedure are led to the address coder via the address bus 5, and the respective lines 0 and 256 are read out of the memory cell matrix 2 via the data bus 6, and are compared within the controller 1 to the bit patterns 7 and 8 which were previously written there. If an agreement is ascertained, the test is then successful with regard to the eighth bit (bit no. 8). This test is then repeated in an analogous manner for the remaining address bits 0 to 7 and 9-11. If these tests are concluded and no fault has been determined, the address bus and the address coder are without fault with regard to stuck-at address faults.

Figure 2:
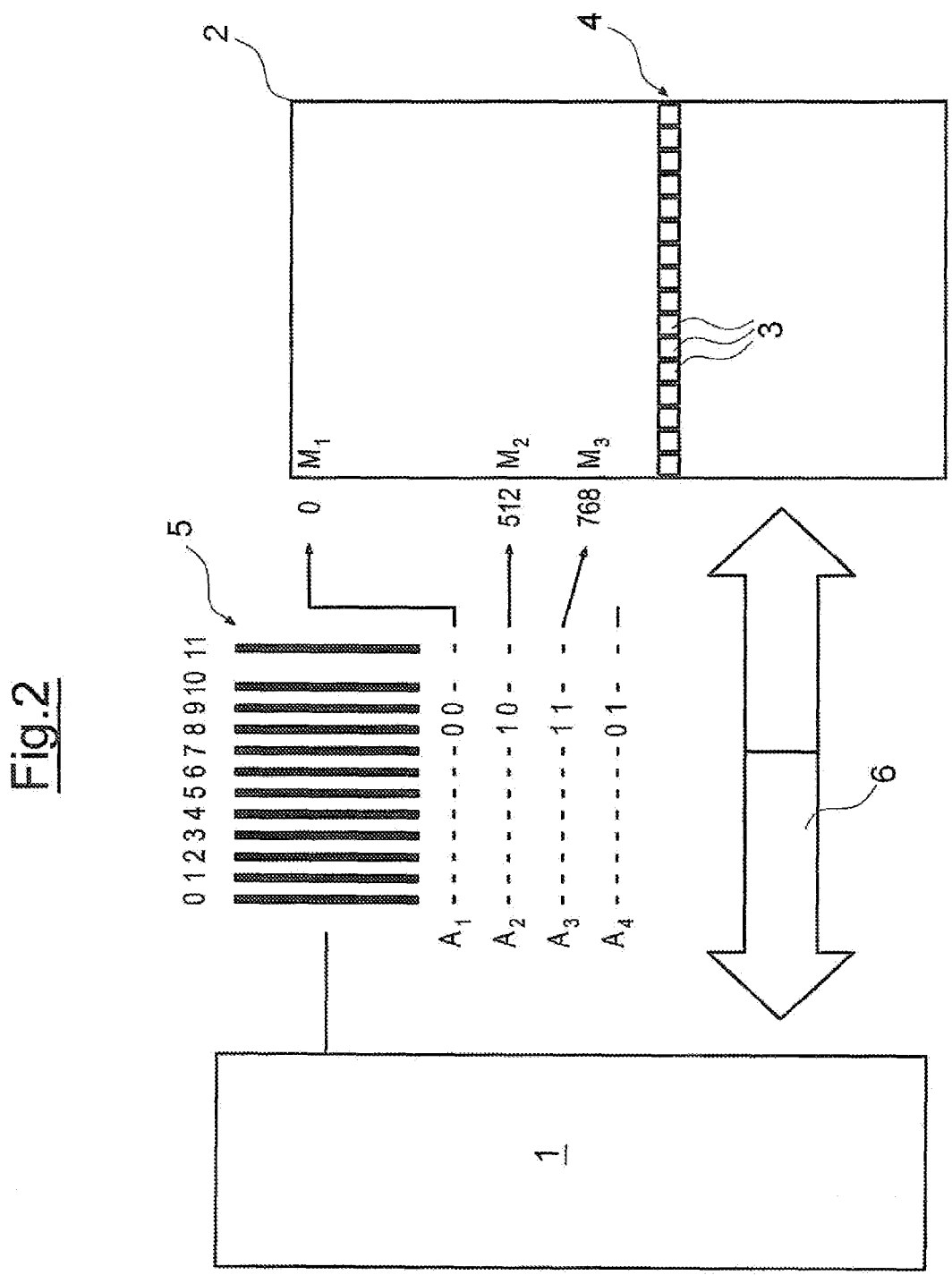
FIG. 2 is a schematic representation of the method for testing the address bus/address coder with regard to coupling address faults according to FIG. 1.

One then tests as to whether the address bus/address coder also functions in a fault-free manner with regard to coupling address faults. This method is explained by way of FIG. 2, and specifically by way of the eighth and ninth bit (bit no. 8 and 9) of the address bus 5. A first address A1 is addressed by way of the controller 1, which comprises the eighth and ninth bit of the data bus, in each case with the value 0. If which is assumed here by way of example, the remaining bits of the address bus are likewise set to 0, then an addressing of the line 0 of the memory cell matrix 2 results from this. A bit pattern M1 is written into this matrix via the data bus 6. Then the address A3 at which the eight and ninth bit of the address bus are set to 1, all remaining ones to 0, is selected by the controller 1. The addressing of the line 768, into which a bit pattern M3 is written, results from this. Then an address A2 in which the eighth bit is set to 1 and the ninth bit to 0, is activated by way of the controller 1, and the remaining bits of the address bus are likewise set to 0, so that the addressing of the line 512 into which a bit pattern M2 is written, results in the memory matrix 2. Alternatively to the address A2, one may also here address the address A4 in which the eighth bit is set to 0 and the ninth bit is set to 1. Then there results an address line, into which the bit pattern M2 may be written After the bit patterns M1, M2 and M3 which must differ from one another, are written into the memory cell matrix 2, by way of renewed addressing A1, A2, A3 or A4, the respective lines of the memory cell matrix 2 are selected and read out, are led via the data bus 6 to the controller 1, where these are compared to the originally described bit patterns M1, M2, M3. The test is completely successfully on agreement of the written and read bit patterns M1 to M3. It is then to be continued, wherein for a complete test of the address bus/ address coder with regard to coupling address faults, each of the twelve address bits are to be combined with another address bit as previously described, and then the previously described test is to be carried out.

For the complete testing with regard to coupling address faults, the previously described test is thus to be carried out for the address bits 0 and 1, 0 and 2, 0 and 3 to 0 and 11, thereafter for the address bits 1 and 2, 1 and 3, 1 and 4 to 1 and 11, thereafter for the address bits 2 and 3, 2 and 4, 2 and 5 to 2 and 11, etc., until all address bit combinations have been checked through. Thus 198 address bit combinations result with the above embodiment example, which are to be tested with the triple write test and read test which has been described previously. It is evident that this testing may also be effected in any other sequence.

If also this test has been concluded, the address bus/address coder is completely tested. It is evident that the testing of the address bus/address coder, be it with regard to stuck-at address faults as well as with regard to coupling address faults, may be infinitely interrupted and continued according to the above described method. The same also applies to the cell test which is to be carried out separately therefrom and with which the memory cells 3 themselves are tested.

According to the present invention, by way of example, two methods are envisaged for the method for testing the memory cells which are independent of the testing of the address bus/address coder.

Figure 3:
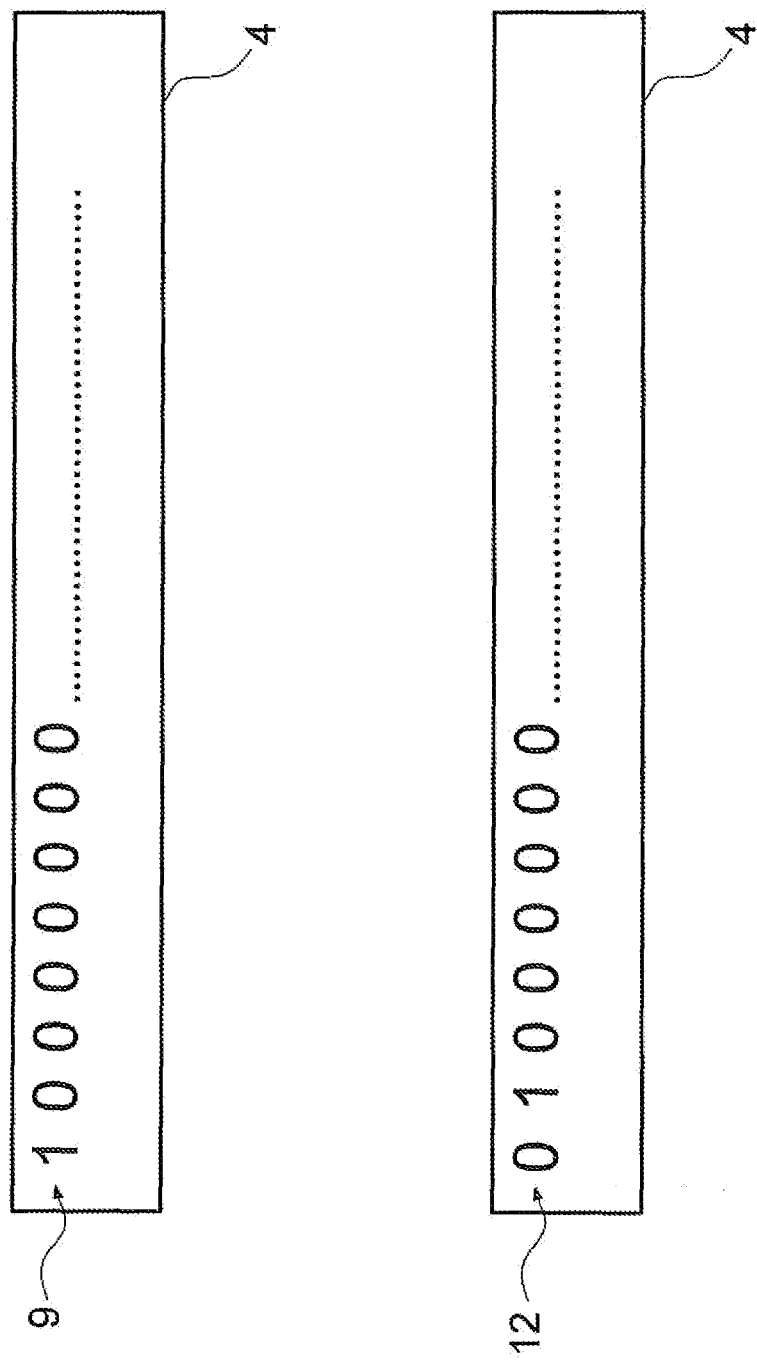
FIG. 3 shows two bit patterns of a first method for testing the memory cells.

The method represented by way of FIG. 3 functions in a manner such that each individual cell 3 of the memory cell matrix 2 is set to 1 in a successive manner, wherein the remaining cells 3 at least of the same memory cell line 4 are set to 0. The test thus begins by way of example by way of addressing the first memory cell line 4 (this is the line 0 in FIG. 2), whereupon the first bit of this memory cell line is set to 1, whereas all remaining bits remain at 0. This bit pattern 9 is then written via the data bus 6 into the first memory cell line 4 and is subsequently read out, wherein one tests as to whether all bits display the value 0 with the exception of the first bit. The second bit is then set to 1 in an analogous manner, wherein all remaining bits have the value 0, so that the bit pattern 12 results, which is then written into this line 4 and subsequently read out again and tested. This is continued until all the bits of a line, thus with the memory cell matrix 2 represented by way of FIGS. 1 and 2, all 16 bits of a memory cell line 4, have been tested. This test is then continued line for line, until the complete matrix 2 has been examined. With this test too, it is evident that it may be interrupted at any time and may be continued again after the interruption. Usefully, an interruption is effected after completion of the testing of a line 4.

Figure 4:
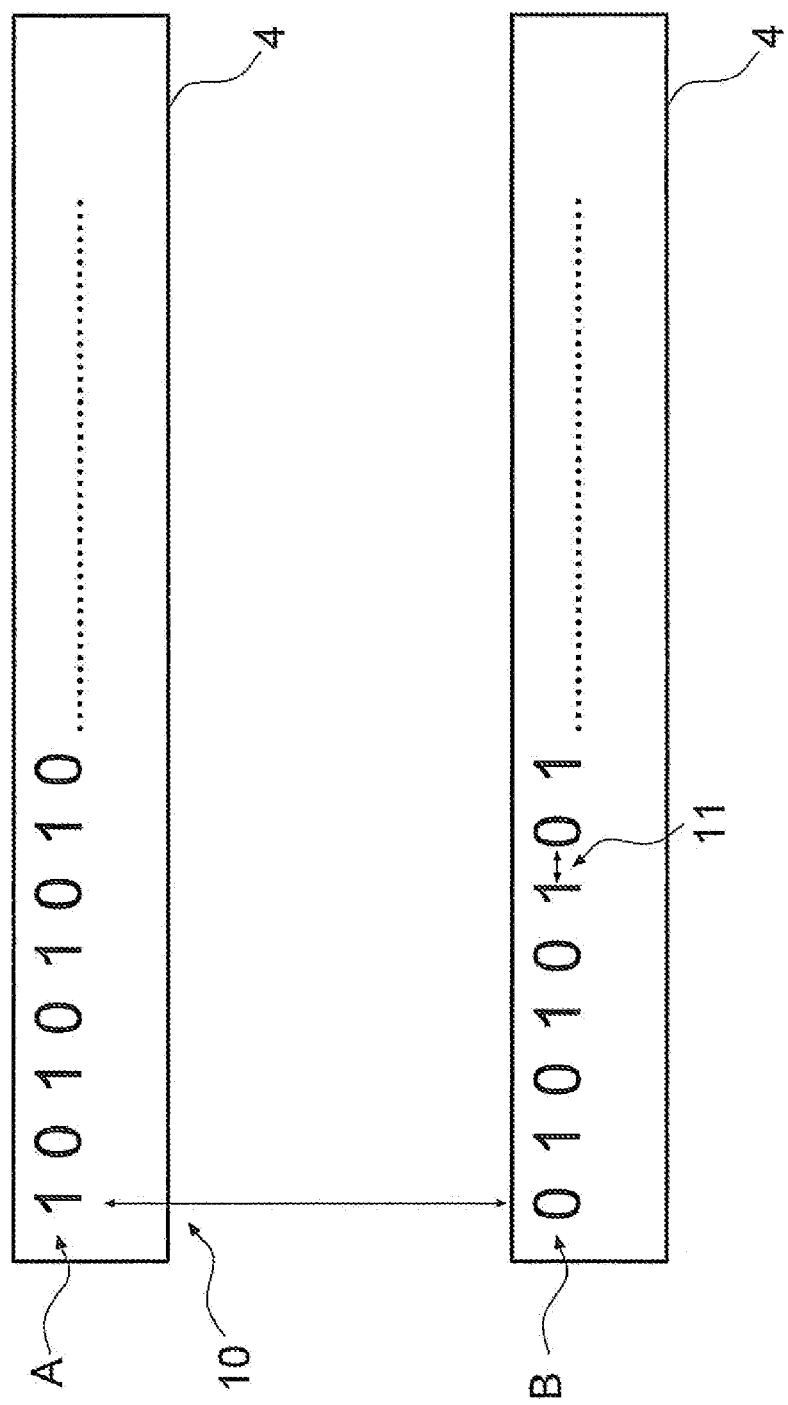
FIG. 4 shows two bit patterns of a second method for the testing of memory cells in a lined manner.

An alternative method for testing the memory cells 3 is described by way of FIG. 4. Here too, the memory cell test is effected in a lined manner, however here all cells 3 of a line 4 are practically tested in one working procedure. Firstly, a bit pattern 1 0 1 0 etc. is written into a memory line 4 up to the end of the line into the memory cell line 4. Such a pattern A is represented in FIG. 4 at the top. As FIG. 4 shows, the memory cells 3 of a memory line 4 are set alternately to 0 and 1 beginning with 1. Then the same line is written with an inverse bit pattern B, so that the first line 3 now assumes the value 0 and the adjacent line 3 assumes the value 1 etc., as is represented in FIG. 4 at the bottom.

The lines 4 with the bit patterns A and B and which are read out in each case after the storage are intermediately stored in the controller 1 and are compared in a bit-like manner. Thereby, firstly it is checked once by way of the read-out bit patterns A and B, as to whether a change of the bit from 0 to 1 or from 1 to 0 has been effected in each cell 3, as is indicated by the comparison 10 in FIG. 4. This test determines stuck-at cell faults. Furthermore, one tests by way of the read-out second bit pattern B as to whether adjacent cells 3 of the read-out line 4 have the value 0 and 1 in an alternating manner or not. This test determines coupling cell faults.

The previously described test is also carried out in a lined manner over the complete matrix 2, in order to completely test the memory cell matrix 2 with regard to cell faults. This test too, as is evident without further ado, may also be interrupted preferably after the completion of the testing of a line 4, and be continued with the testing of the next line at a given time. The sequence too of the lines 4 to be tested is not necessary predefined, and it may be selected as previously described, or selected in an infinitely different manner.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Figure 5:
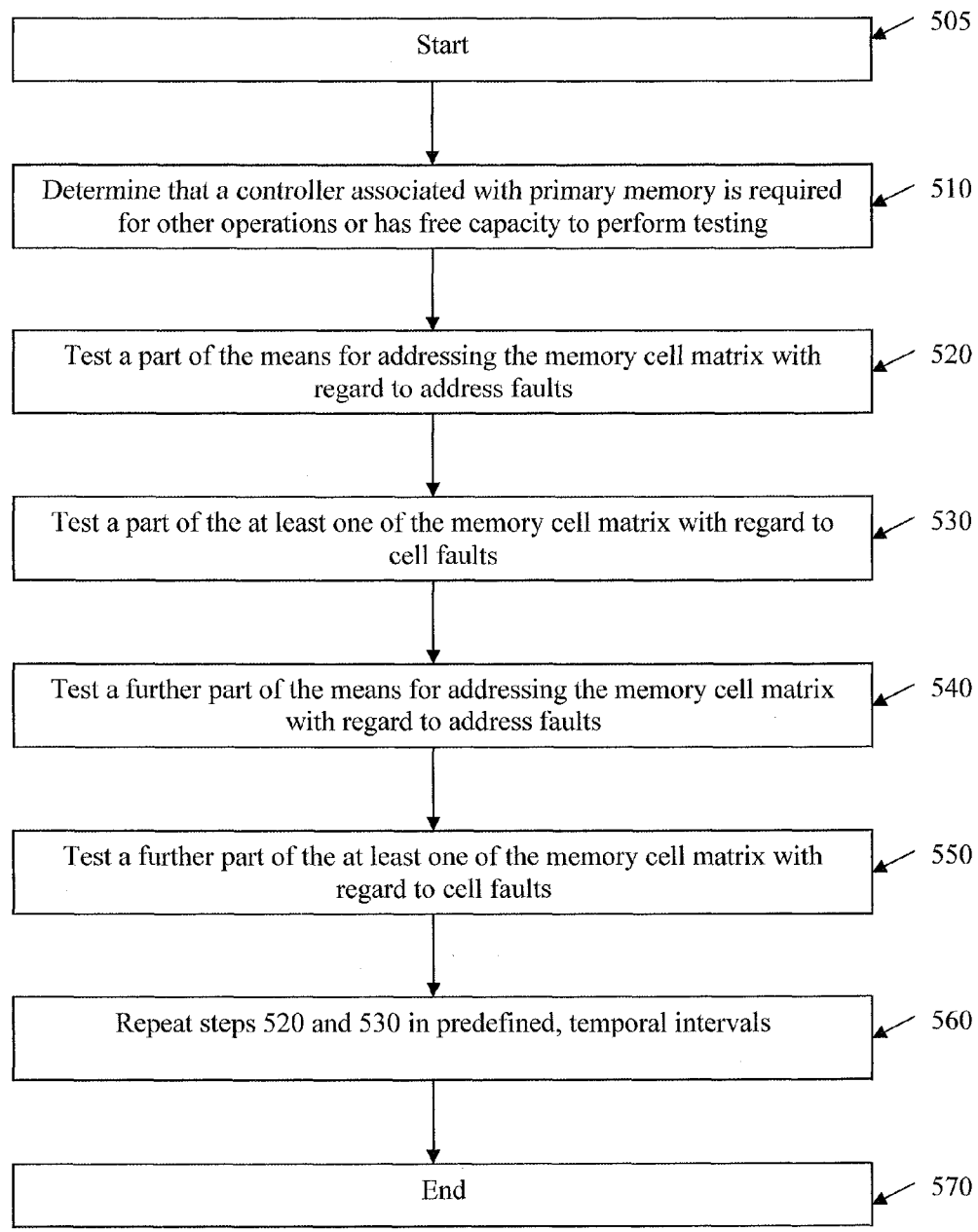
FIG. 5 is a flowchart of a method for testing a primary memory according to the preferred embodiment of the present invention.

Referring to FIG. 5, a flowchart of a method for testing a primary memory is shown. The method starts at step 505 and proceeds to step 510, where it is determined whether a controller associated with the primary memory is required for other operations or has free capacity to perform the testing. At step 520, a part of the means for addressing the memory cell matrix is tested with regard to address faults. At step 530, a part of the at least one of the memory cell matrix is tested with regard to cell faults. The testing steps are performed independently of one another. At step 540, a further part of the means for addressing is tested with regard to address faults. At step 550, a further part of the at least one of the memory cell matrix is tested with regard to cell faults. At step 560, testing steps 520 and 530 are repeated in predefined, temporal intervals. The process ends at step 570.

Figure 6:
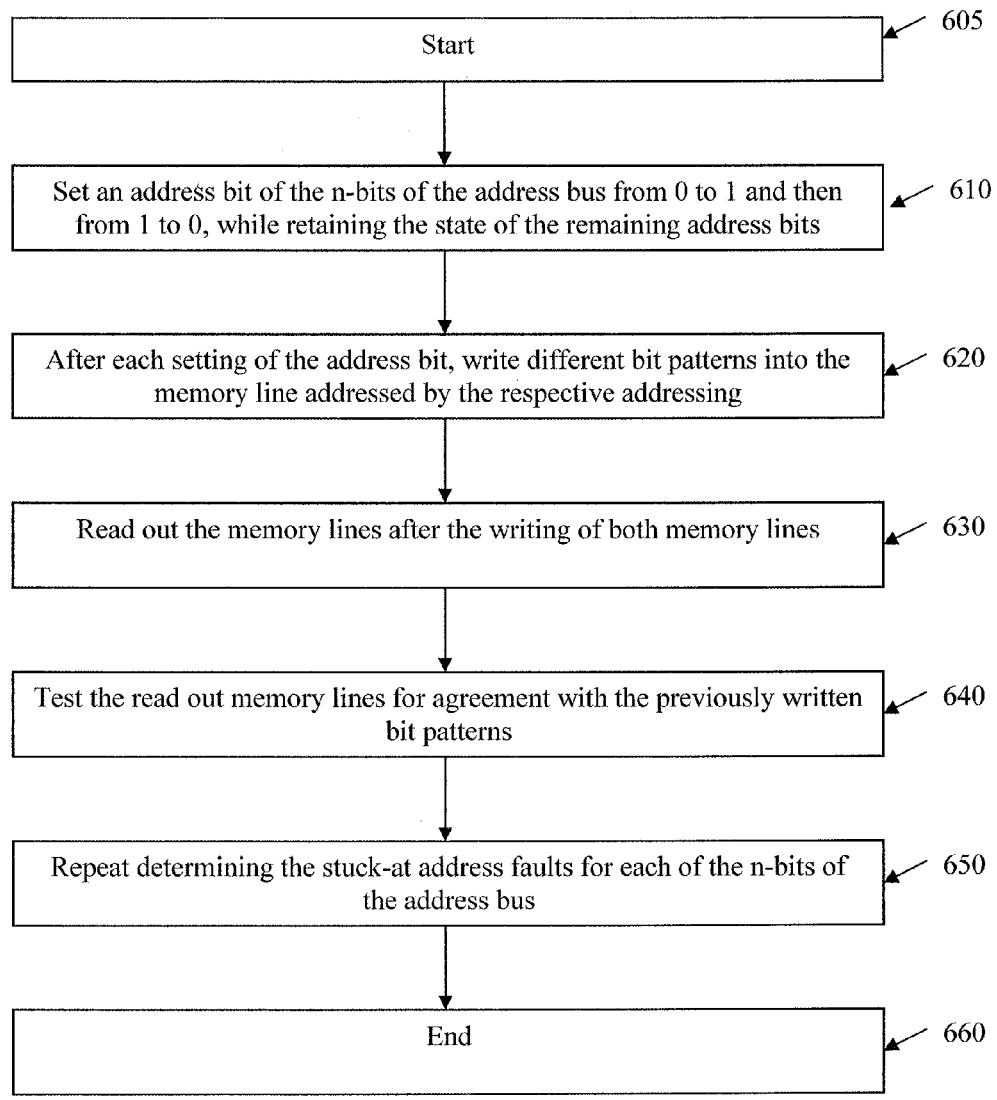
FIG. 6 is a flowchart of a method for determining stuck-at address faults according to a preferred embodiment of the present invention.

FIG. 6 is a flowchart of a method for determining stuck-at address faults. The process starts at step 605 and proceeds to step 610, where an address bit of the n-bits of the address bus is set from 0 to 1 and then from 1 to 0, while retaining the state of the remaining address bits. At step 620, after each setting of the address bit, different bit patterns are written into the memory line addressed by the respective addressing. At step 630, memory lines are read out after the writing of both memory lines. At step 640, the read out memory lines are tested for agreement with the previously written bit patterns. At step 650, determining stuck-at address faults is repeated for each of the n-bits of the address bus. The process ends at step 660.

Figure 7:
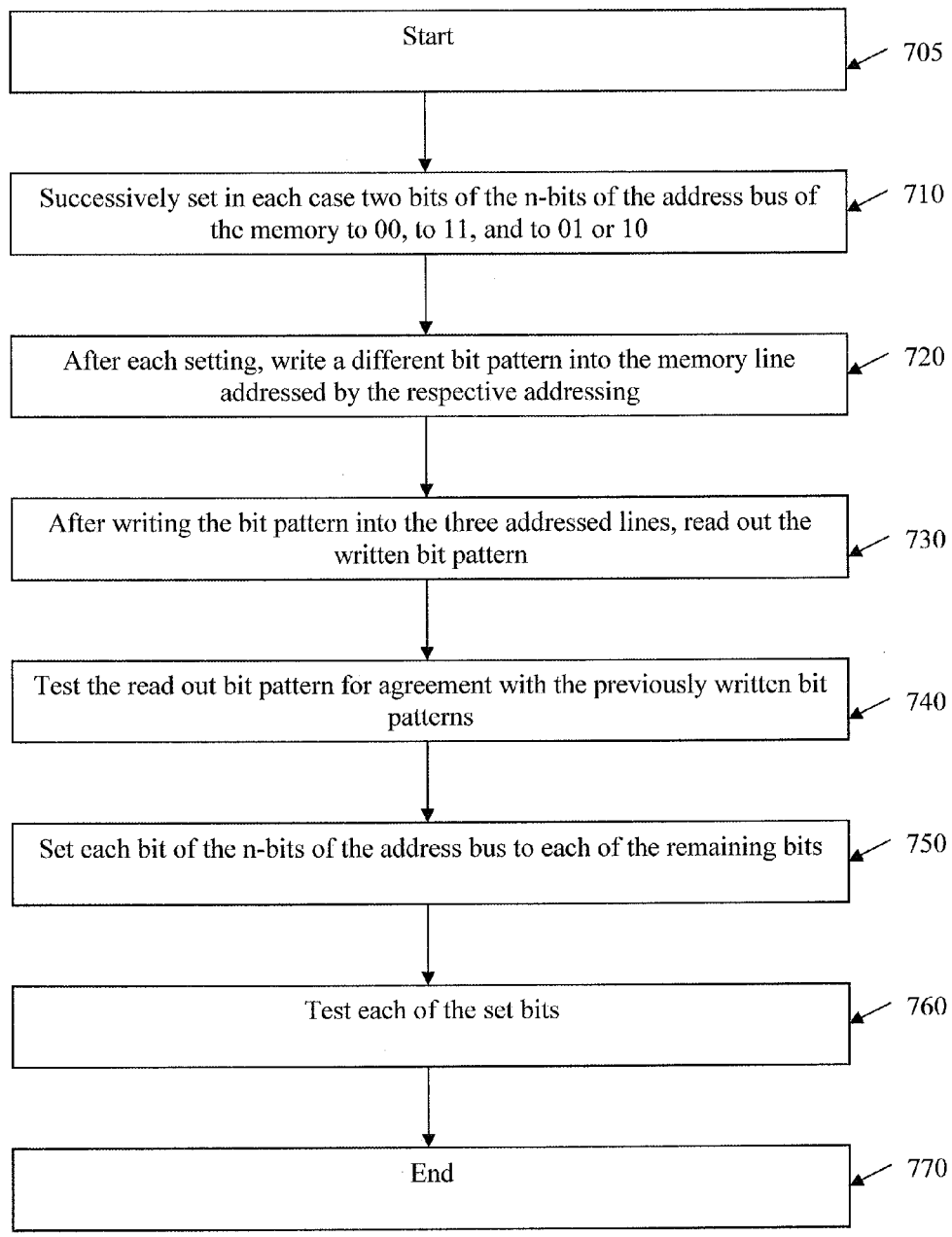
FIG. 7 is a flowchart of a method for determining coupling address faults according to a preferred embodiment of the present invention.

FIG. 7 is a flowchart of a method for determining coupling address faults. The process starts at step 705, and proceeds to step 710, where in each case two bits of the n-bits of the address bus of the memory are successively set to 00, to 11, and to 01 or 10. At step 720, after each setting, a different bit pattern is written into the memory line addressed by the respective addressing. At step 730, after writing the bit pattern into the three addressed lines, the written bit pattern is read out. At step 740, the read out bit pattern is tested for agreement with the previously written bit patterns. At step 750, each bit of the n-bits of the address bus is set to each of the remaining bits. At step 760, each of the set bits is tested. The process ends at step 770.

Figure 8:
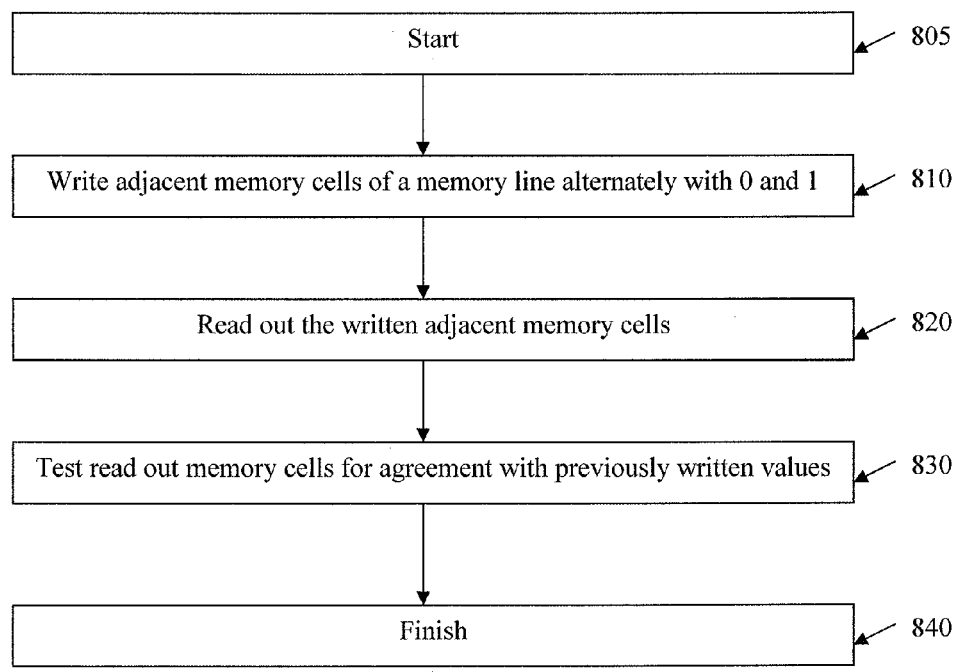
FIG. 8 is a flowchart of a method for testing a part of at least one memory cell matrix with regard to cell faults according to a preferred embodiment of the present invention.

FIG. 8 is a flowchart of a method for testing a part of at least one memory cell matrix with regard to cell faults. The process starts at step 805, and proceeds to step 810, where adjacent memory cells of a memory line are written alternately with 0 and 1. The written adjacent memory cells are read out at step 820. The read out memory cells are tested for agreement with previously written values at step 830. The process ends at step 840.

Figure 9:
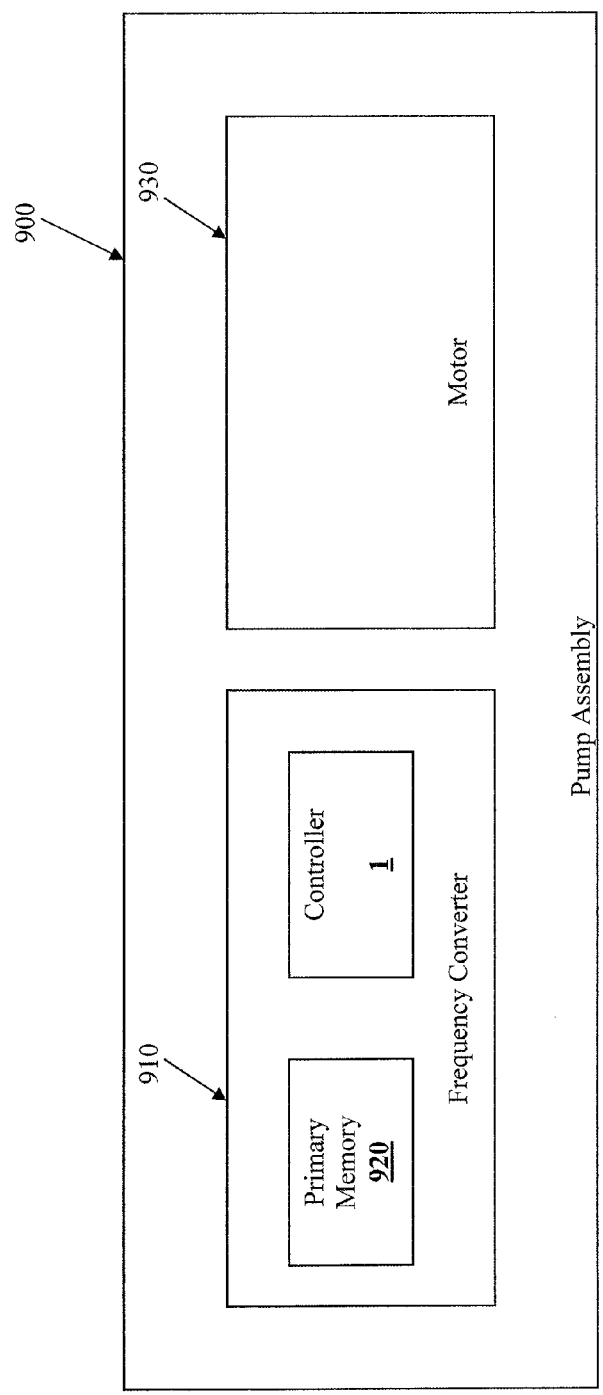
FIG. 9 is a system diagram of a pump assembly having a frequency converter and a motor according to a preferred embodiment of the present invention.

FIG. 9 is a system diagram of a pump assembly 900 having a frequency converter 910 and a motor 930. The frequency converter 910 includes a primary memory 920 having at least one matrix of memory cells, means for addressing the at least one memory cell matrix, and a write/read circuit. The frequency converter 910 also includes a controller 1. The controller 1 is configured to automatically examine the primary memory 920. The motor 930 is controlled by the frequency converter 910 through control and regulation electronics (not shown).

We claim:

1. A pump assembly comprising:
a frequency converter having control and regulation electronics, the control and regulation electronics comprising:
a primary memory having (i) at least one matrix of memory cells, (ii) means for addressing the at least one memory cell matrix, and (iii) a write/read circuit, and
a controller, wherein the controller is configured to automatically examine the primary memory by (a) examining at least a part of the means for addressing with regard to address errors, and (b) examining at least a part of the memory cells with regard to cell errors, wherein the examining steps (a) and (b) are performed independently of one another, and wherein step (a) comprises examining individual address bits of an n-bit wide address bus in steps that are performed independently of one another, depending on use of the primary memory for operation of the frequency converter; and
a motor, wherein the frequency converter controls the motor through control and regulation electronics.

2. A method for testing a primary memory of control and regulation electronics of a frequency converter, the primary memory including (i) at least one matrix of memory cells, (ii) means for addressing the at least one memory cell matrix, and (iii) a write/read circuit, the method being performed during operation of the frequency converter, the method comprising:
(a) examining at least a part of the means for addressing with regard to address errors; and
(b) examining at least a part of the memory cells with regard to cell errors,
wherein the examining steps (a) and (b) are performed independently of one another, and
wherein step (a) comprises examining individual address bits of an n-bit wide address bus in steps that are performed independently of one another, depending on use of the primary memory for operation of the frequency converter.

3. A method according to claim 2, wherein step (a) is performed before step (b), the method further comprising:
(c) examining a further part of the means for addressing with regard to address errors; and
(d) examining a further part of the memory cells with regard to cell errors.

4. A method according to claim 3, wherein step (c) is performed before step (d).

5. A method according to claim 2, further comprising:
(c) repeating steps (a) and (b) in predefined, temporal intervals.

6. A method according to claim 2, further comprising:
(c) determining whether a controller associated with the primary memory is required for other operations or has free capacity to perform the testing prior to initiating the examining steps (a) and (b).

7. A method according to claim 6, wherein the examining steps (a) and (b) are interrupted and subsequently continued.

8. A method according to claim 2, wherein step (a) further comprises determining at least one of stuck-at address faults and coupling address faults.

9. A method according to claim 8, wherein determining stuck-at address errors is performed by:
(i) setting an address bit of the n-bits of the address bus from 0 to 1 and then from 1 to 0, while retaining the state of the remaining address bits;
(ii) after each setting of the address bit, writing different bit patterns into the memory line addressed by the respective addressing;
(iii) reading out the memory lines after the writing of both memory lines; and
(iv) examining the read out memory lines for agreement with the previously written bit patterns.

10. A method according to claim 9, further comprising repeating determining the stuck-at address faults for each of the n-bits of the address bus.

11. A method according to claim 9, wherein the bit pattern written into the respective memory line contains or corresponds to the binary address for the associated memory line.

12. A method according to claim 8, wherein determining coupling address errors further comprises:
- (i) successively setting in each case two bits of the n-bits of the address bus of the memory to 00, to 11, and to 01 or 10;
- (ii) after each setting, writing a different bit pattern into the memory line addressed by the respective addressing;
- (iii) after writing the bit pattern into the three addressed lines, reading out the written bit pattern; and
- (iv) testing the read out bit pattern for agreement with the previously written bit patterns.

13. A method according to claim 12, wherein each bit of the n-bits of the address bus is set to each of the remaining bits and tested.

14. A method according to claim 12, wherein the bit pattern written into the respective line contains or corresponds to the associated binary address.

15. A method according to claim 2, wherein step (b) is performed by:
- (i) writing adjacent memory cells of a memory line alternately with 0 and 1;
- (ii) reading out the written adjacent memory cells; and
- (iii) testing the read out memory cells with regard to agreement with the previously written values, whereupon a reverse writing with 1 and 0, reading out and testing is effected.

16. A method according to claim 2, wherein step (b) is performed by successively writing each individual memory cell of a memory line with 1 and the remaining memory cells with 0, reading them out and testing them.

17. A method according to claim 2, further comprising:
- (c) storing at least one bit pattern which is written into the memory cell matrix or which is read out of the memory cell matrix in a controller.

* * * * *